United States Patent [19]

Golub et al.

[11] Patent Number: 5,539,761
[45] Date of Patent: Jul. 23, 1996

[54] RESONANT TUNNELING OSCILLATORS

[75] Inventors: John Golub, Jerusalem; Michael Rosenbluh, Givat Shmuel; Edith Grumann, Jerusalem; Michael Matusovsky, Bat Yam, all of Israel

[73] Assignees: Yissum Research Development Company of the Hebrew University of Jerusalem; Bar Ilan University, both of Israel

[21] Appl. No.: 248,817

[22] Filed: May 24, 1994

[51] Int. Cl.$^6$ ........................................... H01S 3/00
[52] U.S. Cl. ........................................... 372/38
[58] Field of Search .................. 257/25, 14; 331/107 T, 331/108 B, 116 M; 372/38, 18, 25

[56] References Cited

U.S. PATENT DOCUMENTS 4,831,340  5/1989  Sollner ........................................ 257/25
5,265,107  11/1993  Delfyett, Jr. ................................ 372/11

OTHER PUBLICATIONS

Böttcher et al., "Detection of pulse to pulse timing, jitter in periodically gain–switch semiconductor lasers," *Applied Physics Letters*, vol. 54, 1989, pp. 1971–1973 No Month.
Bowers et al., "Actively Mode–Locked Semiconductor Lasers," *IEEE Journal of Quantum Electronics*, vol. 25, 1989, pp. 1426–1439 No Month.
Capasso et al., *High–Speed Semiconductor Devices*, (Wiley–Interscience, 1990), ed. S. M. Sze, pp. 465–520 No Month.
Gravé et al., "Monolithic integration of a resonant tunneling diode and a quantum well semiconductor laser," *Applied Physics Letters*, vol. 58, 1991, pp. 110–112 No Month.
Brown et al., "Oscillations up to 712 GHz in InAs/AlSb resonant–tunneling diodes," *Applied Physics Letters*, vol. 58, 1991, pp. 2291–2293 No Month.
Lann et al., "Phase locking between light pulses and a resonant tunneling diode oscillator," *Applied Physics Letters*, vol. 62, 1993. 13–15 No Month.
England et al., "Optical switching in a resonant tunneling structure," *Applied Physics Letters*, vol. 58, 1991, pp. 887–889 No Month.

*Primary Examiner*—Rodney B. Bovernick
*Assistant Examiner*—Robert E. Wise
*Attorney, Agent, or Firm*—Charles S. Guenzer

[57] ABSTRACT

A phase-controlled oscillator using a resonant tunneling diode (RTD), which is included in a self-oscillating biasing circuit. A biasing voltage controls the phase of the pulsating output relative to a pulsating input signal. If the output modulates a laser, the pulse position of the laser output can be varied in time. If the output modulates a microwave or other emitter have an electromagnetic frequency equal to that of the RTD biasing circuit, the electromagnetic phase of the emission is controlled, thereby allowing phase-array radars using multiple RTD biasing circuits. Also, multiple RTD biasing circuits can have self-oscillation frequencies which are rational fractions of a single master clock frequency driving all of them. The outputs then have different frequencies but are phase locked.

16 Claims, 8 Drawing Sheets

RESONANT TUNNELING OSCILLATORS

FIELD OF THE INVENTION

In general, the invention relates to a semiconductor quantum-well device. In particular, the invention relates to a resonant tunneling device configured as an oscillator, particularly when the phase of its output is controlled.

BACKGROUND ART

The modern development of optical fibers and semiconductor diode lasers has enabled optical signaling at very high bit rates, Examples of such optical signaling are fiber-optic communications, physical measurements, time-division multiplexing, and electrooptical sampling. However, the full potential of such systems depends upon the generation of picosecond optical pulses at multigigahertz repetition rates, the flexible synchronization of the optical pulses to an external clock, and the time translation of the optical pulses with respect to the external clock.

Such systems typically rely upon the generation of picosecond optical pulses by one of two methods, gain switching and mode locking. In gain switching, a pulsed current source directly modulates the drive current of a diode laser. Current modulation results in a light pulse whose duration is approximately equal to the current pulse duration. In active mode locking, the drive current of a laser diode is periodically modulated at a frequency determined by the cavity resonant frequency f of the diode laser, $$f = \frac{c}{2nL}, \qquad (1)$$

where c is the speed of light, n is the index of refraction of the lasing material, and L is the physical length of the diode laser. The modulation frequency may be equal to the natural frequency of the diode laser or to some multiple thereof. Mode locking produces pulses which are significantly shorter than pulses produced by current modulation.

Systems based upon gain switching and mode locking need to be compared based upon the key parameters discussed above. Mode locked systems produce shorter, i.e. faster, optical pulses. Shortened pulse duration is related to high performance in applications such as optical-fiber communication. However, mode locked systems require modulation of the current at a precise frequency. On the other hand, gain switched systems produce generally longer pulses, but the frequency of current modulation can be flexibly varied, thereby allowing an easy variation of the repetition rate of the optical pulses.

Gain switched systems are easily synchronized to external timing circuitry while mode locked systems are difficult to synchronize. Such external timing circuitry may, for example, be a system clock in an optical communication system or a device under test in an electrooptic sampling application.

Gain switching allows a straightforward method of modulating a data signal in which a silicon transistor is clocked to an oscillator and it modulates the drive current of the laser. However, drive current modulation by itself is unsatisfactory. The modulation is limited to about 8 ps, and modulation causes the frequency to chirp as the laser begins to lase. Also, silicon transistors incorporated into such current drive circuitry are typically limited to a bit rate of somewhat more than 1 Gb/s. Böttcher et al. have described timing jitter incurred in current modulation in "Detection of pulse to pulse timing jitter in periodically gain-switch semiconductor lasers," *Applied Physics Letters,* vol. 54, 1989, pp. 1971–1973.

Bowers et al. have developed the theory of mode locking, as introduced above, in "Actively Mode-Locked Semiconductor Lasers," IEEE *Journal of Quantum Electronics,* vol. 25, 1989, pp. 1426–1439.

Hybrids of gain switching and mode locking offer increased speed. Delfyett, Jr. has described the generation of a train of very short pulses in U.S. Pat. No. 5,265,107 using a laser that is mode locked both by a saturable absorber and by an RF signal applied to the lasing medium at a frequency matched to the mode spacings of the external cavity. Systems relying upon the combination of direct modulation and saturable absorbers are generally limited to transition times of 1 or 2 ps although Delfyett, Jr. provides a somewhat faster system in the previously cited patent.

Recently researchers have recognized the capability of resonant-tunneling diodes (RTDs) for high-frequency oscillation. Capasso et al. have described such devices in *High-Speed Semiconductor Devices,* (Wiley-Interscience, 1990), ed. S.M. Sze, pp. 465–520, and Gravé et al. have described the biasing of these devices in "Monolithic integration of a resonant tunneling diode and a quantum well semiconductor laser," *Applied Physics Letters,* vol. 58, 1991, pp. 110–112. A basic explanation of their operation is now presented.

The electronic band structure of such a semiconductor device is shown in FIG. 1. An input-side conduction band 10 and an output-side conduction band 12 are physically separated by a tunnel junction 14 including two barriers 16 and an intermediate quantum well 18. The well 18 is so thin that resonant electronic quantum states 22, 24, and 26 are formed in the well 18. In the simple example shown in FIG. 1, both the input and output sides 10 and 12 and the junction 14 are undoped, and it is assumed that donor conduction predominates.

In the unbiased state shown in FIG. 1 or at relatively low biasing voltage, no significant conduction occurs through the junction 14. However, when the junction 14 is electrically biased, as shown in FIG. 2, with the input-side conduction band 10 energetically above the output-side conduction band 12 so that the first resonant state 22 energetically aligns with the input-side conduction band 10, electrons tunnel through the first barrier 16 to the resonant state 22 in the well 18 and then again through the second barrier 16 to above the output side 12. Such alignment provides a high conductivity between the input and output sides 10 and 12, but the conductivity falls on both sides of the alignment so that, on the upper voltage side of the conductivity peak, the differential conductivity or resistivity is negative. Because of the conductivity peak, such devices can form the basis of bistable circuits, as described by Gravé et al.

This bistability in resonant tunneling diodes has long been recognized as providing high-speed oscillators, as has been described by Brown et al. in "Oscillations up to 712 GHz in InAs/AlSb resonant-tunneling diodes," *Applied Physics Letters,* vol. 58, 1991, pp. 2291–2293. Lann et al. in "Phase locking between light pulses and a resonant tunneling diode oscillator," *Applied Physics Letters,* vol. 62, 1993, pp. 13–15, have described the phase and frequency locking of an RTD oscillator to an external signal source. When the RTD circuit is loaded by a tank circuit, the RTD oscillates freely at some frequency $v_{free} = v_{RTD}$, where $v_{free}$ is the free oscillation frequency of the RTD and $v_{RTD}$ is the frequency at which the RTD is driven. When driven by an external periodic signal at a frequency $v_{ext}$, the RTD can adjust is frequency so that $$v_{RTD} = \frac{p}{q} \cdot v_{ext}, \qquad (2)$$

where p and q are positive integers. For example, if p/q=1, there exists a band of frequencies such that when the external signal frequency $v_{ext}$ lies within this band, the RTD adjusts its frequency to maintain $v_{RTD}=v_{ext}$ throughout the band. The width of the band increases with increasing amplitude of the external signal.

When the RTD oscillator and the external signal are locked in the simple relation $v_{RTD}=v_{ext}$ or in the harmonic relationship $v_{RTD}=p \cdot v_{ext}$ or in the subharmonic relationship $v_{RTD}=v_{ext}/p$, phase locking also occurs. This phase locking causes a constant phase relation between the RTD output and the external signal input to the RTD oscillator. In Lann et al., the precise phase varies as the external frequency $v_{ext}$ is tuned over the locking band.

England et al. have also described the optical switching of resonant tunneling diodes in "Optical switching in a resonant tunneling structure," *Applied Physics Letters*, vol. 58, 1991, pp. 887–889. Gravé et al. in the previously mentioned article have described an RTD switch driving a semiconductor laser.

Nonetheless, the prior art lacks a high-speed oscillator in which the phase of its output relative to its controlling input can be easily controlled.

SUMMARY OF THE INVENTION

According to one aspect of the invention, a resonant tunneling diode (RTD) is configured as an oscillator, and it drives a semiconductor laser to produce a train of very short optical pulses through mode locking. When the resonant tunneling diode is included in a feedback circuit, the optical pulses become even shorter. The resonant tunneling diode can be slaved (frequency and phase locked) to another signal source, and the bias of the resonant tunneling diode is used to control the phase of its output relative to the clocking input of the RTD. This phase shifting translates into a time shifting of the picosecond optical pulses produced by the laser diode. The time shifting is measured relative to the external signal source. Such phase control allows purely electrical temporal positioning of the pulse and contrasts with mechanical methods of pulse shifting such as the use of mechanical delay line. Such timing control allows pulse position modulation in an optical communication system or in an optical sampling oscilloscope in which the extremely short optical pulse is progressively moved in time relative to a trigger.

According to another aspect of the invention, an array of many laser diodes, each driven by its own RTD oscillator, can be constructed and locked to a single external signal source. In such an array, the temporal position of each laser pulse train would be individually controllable. Different laser elements can have different wavelengths. Such an array permits scientific measurements, as well as combined wavelength-time-division multiplexing.

Similarly, different diode laser elements could be locked to different rational ratios (p/q) of a single external signal source. Such an array permits simultaneous electrooptic sampling of signals at a variety of frequencies and other novel sampling schemes.

According to yet another aspect of the invention, the phase-controlled RTD oscillations can be coupled to an element such as an antenna radiating at a similar frequency. An array of such radiating elements, each driven by its own RTD with all the RTDs locked to a single external signal source, provides a flexible, high-speed phased array radar.

DETAILED DESCRIPTION OF THE PREFERRED EMBODIMENTS

Figure 3:
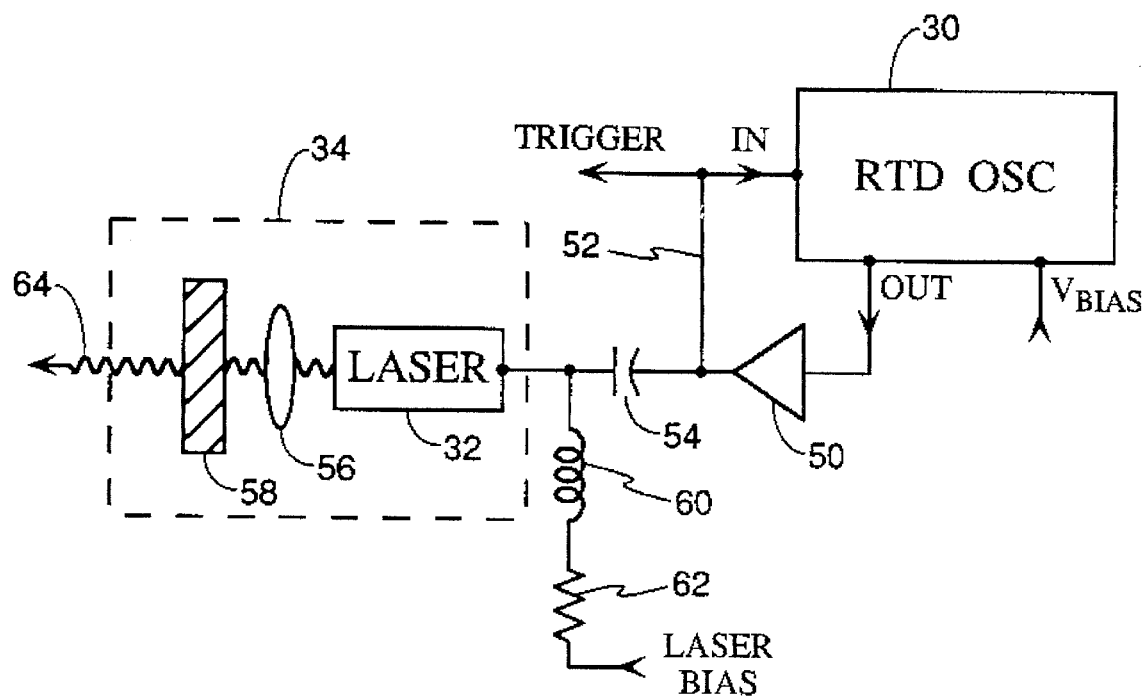
FIG. 3 is a schematic diagram of a laser diode driven by a oscillator circuit including a resonant tunneling diode.

An electrical schematic of a first embodiment of the invention is illustrated in FIG. 3. A resonant tunneling diode (RTD) is used in an RTD oscillator circuit 30 to drive a semiconductor laser diode 32 in an external cavity laser 34.

Figure 4:
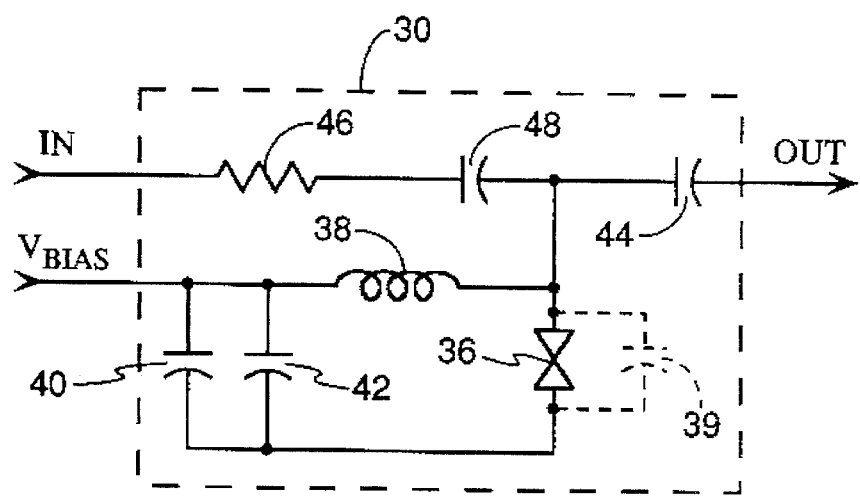
FIG. 4 is a schematic diagram of an oscillator circuit based on a resonant tunneling diode with a clocking input.

The RTD oscillator circuit 30, illustrated schematically in FIG. 4, includes a resonant tunneling diode (RTD) 36. A self-resonating circuit includes an inductor 38, the RTD 36, and capacitance 39 in parallel to the RTD 36. The parallel capacitance 39 includes junction capacitance of the RTD 36 and other parasitic capacitance, and its value is estimated as 2 pF. An input $V_{bias}$ biases the DC voltage of the self-resonating circuit and the RTD 36 through filter capacitors 40 and 42. The output OUT of the circuit is coupled through a blocking capacitor 44. A locking signal may be input through the IN input via a series resistor 46 and a coupling capacitor 48 to frequency- and phase-lock the RTD oscillator. Values of the biasing components are given in the table.

| Inductor | 38 | 10 nH |
| Capacitance | 39 | ≈2 pF |
| Capacitor | 40 | 100 μF |
| Capacitor | 42 | 0.1 μF |
| Capacitor | 44 | 0.001 μF |
| Resistor | 46 | 590 Ω |
| Capacitor | 48 | 0.1 μF |

When a signal of appropriate frequency and amplitude, to be described later, is applied to the input IN, the frequency- and/or phase-locked oscillations of the RTD appear at the output OUT. When the circuit 30 is free running, there is no IN input (it is effectively left floating), and the free oscillations appear at the output OUT. In operation, the small inductance 38, together with parallel parasitic and junction capacitance 39 form an LC circuit. When coupled to the negative differential resistance of the RTD 16, the resultant LRC circuit oscillates at a self-oscillation frequency near 450 MHz. As a result, the inductance 38 and the parallel capacitance 39 and negative resistance of the RTD 16 are connected in a loop circuit, and the bias voltage $V_{bias}$ and the output OUT are connected to different nodes in the loop circuit. Small changes in the bias voltage $V_{bias}$ lead to variations in the value of the negative resistance and thereby tune the oscillation frequency.

The RTD 16 is fabricated of GaAs/AlAs, as described by Lann et al. and is temperature stabilized. It can tune from 440 to 520 MHz in response to variations in bias voltage $V_{bias}$ of 0.2 V.

Returning to FIG. 3, an amplifier 50 amplifies the output of the RTD oscillator 30 and returns the signal. via a feedback line 52 both to the input of the RTD oscillator 30 and to triggering circuitry associated with the experiment, and it also feeds the RTD output at a power level of 19 dBm to the external cavity laser 34 via a coupling capacitor 54. The external cavity laser 34 includes the semiconductor laser 32, internal optics 56, and an mirror output coupler 58, producing a cavity frequency c/2L≈450 MHz. The diode laser 32 may be an HLP 1400 available from Sharp. The front surface of the laser diode 32 is coated for anti-reflection to yield a reflectivity of R<1%. The back of the laser 32 is uncoated, and the output coupler 36 has an 18% transmissivity. The laser 32 is DC biased by a stabilized current source to just below lasing threshold through a DC coupling inductor 60 and a 50—Ω isolation resistor 62. The laser output 64 is monitored with an optical sampling oscilloscope which has a response time of 8 ps and which is triggered by the output of the amplifier 50.

The frequency of the RTD oscillator 30 is tuned by varying the bias voltage $V_{bias}$. When the oscillator is operated without any feedback (the feedback line 52 is disconnected), the oscillator 30 tunes frequency, as illustrated by the discontinuous curve 66 of FIG. 5, from 440 MHz to 520 MHz in response to a tuning voltage change $\Delta V_{bias}$ of 0.2 V. When the free running RTD oscillator drives the laser 14, the oscillator has a frequency spectrum with a full width at −10 dB of 200 kHz on top of a −50 dB pedestal.

Figure 5:
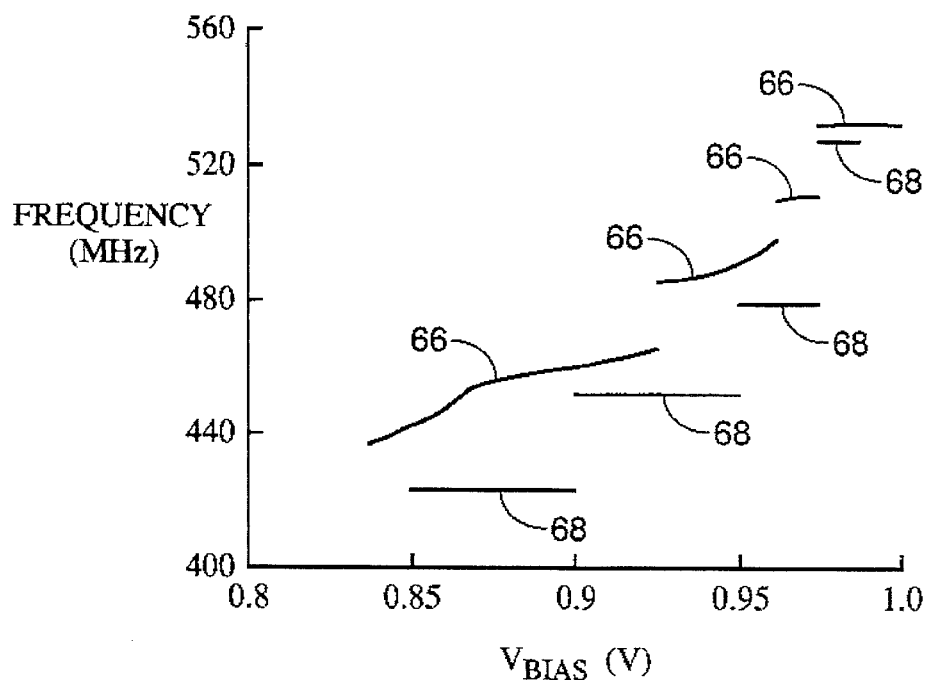
FIG. 5 is a graph of the frequency of the outputs of two types of RTD oscillators.

However, connection of the feedback line 52 provides a feedback loop having 7 dB gain, and this feedback configuration offers several advantages. The discontinuous curve 68 in FIG. 5 shows its biasing tuning, which consists of several fairly flat plateaux. The small non-zero slope of the plateaux offer the ability to fine tune the RTD frequency with small changes in the biasing voltage. The feedback reduces the width of the RTD oscillator output to 40 kHz on top of a −70 dB pedestal. When the RTD oscillator drives the laser, the optical pulse width is about 50 ps; however, the laser mode locking deteriorates outside a 3 MHz tuning range of the RTD oscillator 30. The optical pulse width should further decrease with increased modulation depth and with the increased repetition rate. Thus, even though the experiments presented here operate at 0.5 GHz, the pulse widths should further reduce for anticipated multi-gigahertz operation.

Figure 6:
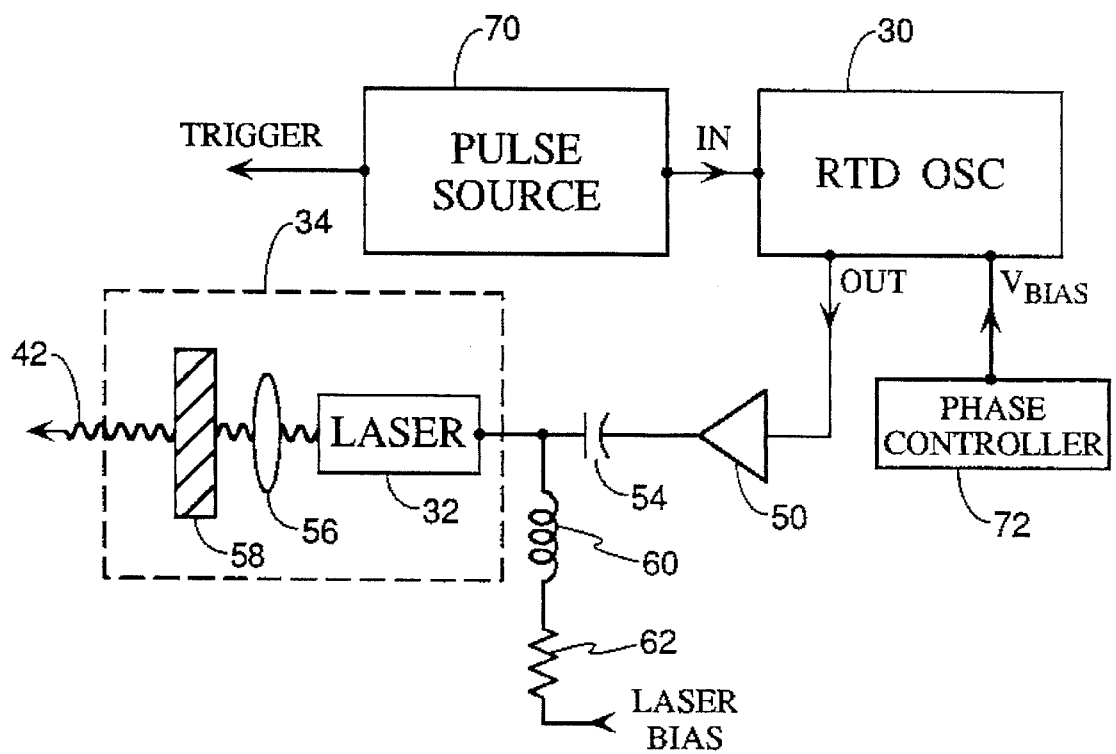
FIG. 6 is a schematic diagram of a laser diode driven by a resonant tunneling diode which is itself driven by another pulse source.
Figure 7:
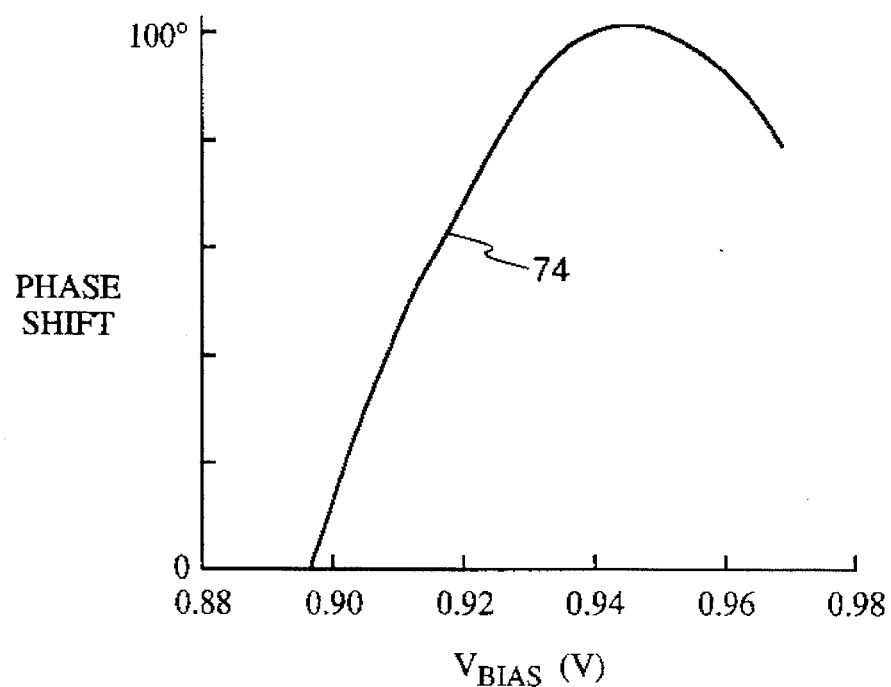
FIG. 7 is a graph of the voltage bias dependence of the phase of the output of an RTD oscillator.

In a second embodiment of the invention, as schematically illustrated in FIG. 6, a periodic pulse source 70 drives the input of the RTD oscillator 30 to thereby slave the oscillator 30 to the pulse source 70. In a confirmatory experiment, the pulse source 70 was a synthesizer having low phase noise. The pulse rate is set near the frequency of the external-cavity laser 34. When the RTD oscillator 30 is locked to the pulse source 70, variations of the biasing voltage $V_{bias}$ input from a phase controller 72 to the RTD oscillator 30 cause a time translation $\Delta t$ between the input and output pulses of the RTD oscillator 30. We have observed a voltage-tunable translation $\Delta t$ of about 500 ps over a bias tuning of 0.1 V. The size of the translation is emphasized when it is expressed as a phase $\phi$ defined as $$\phi = 360° \frac{c}{2L} \Delta t \qquad (3)$$

where c is the speed of light and L is the length of the optical cavity 14. The phase shift $\phi$, as shown by curve 74 in FIG. 7, strongly depends on the bias voltage $V_{bias}$ and varies over nearly 100°. The tuning is nearly linear over a large portion of the curve. Over the linear range, the pulse width and amplitude vary by no more than 10%, and the timing jitter is no greater than that of the pulse source. The inventive phase variation as a function of bias voltage for a fixed frequency compares with the phase variation as a function of variable frequency for a fixed bias voltage, as reported by Lann et al. for an RTD oscillator.

Figure 8:
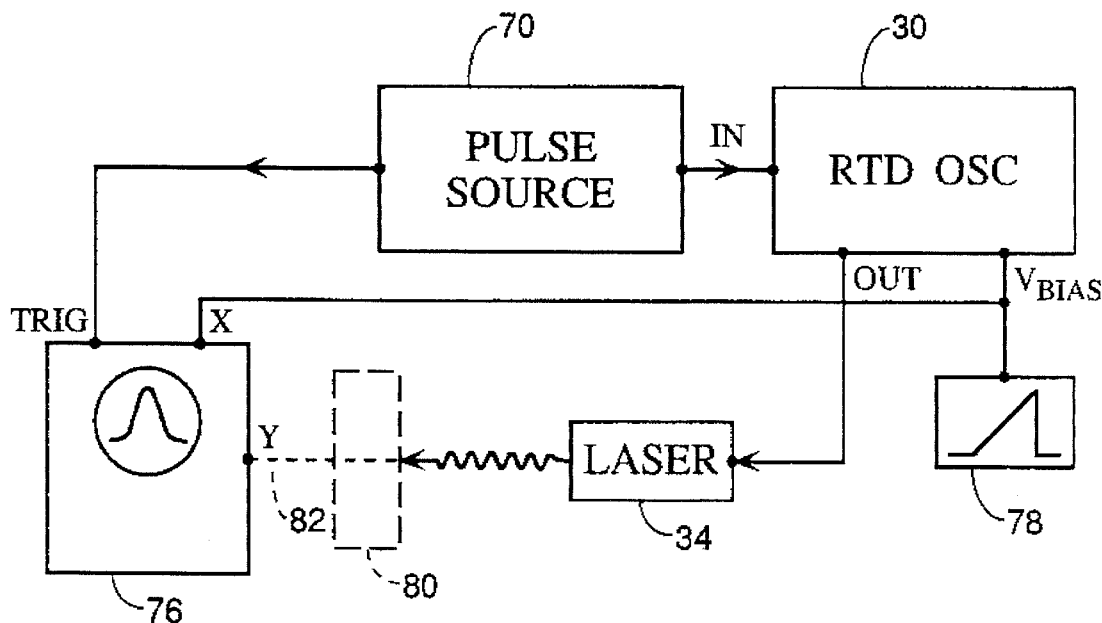
FIG. 8 is a schematic diagram of an electrooptic probe system.

A third embodiment, illustrated in FIG. 8, provides the equivalent of an optical sampling oscilloscope or alternatively an electrooptical sampling system. This figure does not illustrate many of the ancillary elements of FIG. 6. The pulse source 70 provides synchronized triggering pulses to both the RTD oscillator 30 and to an oscilloscope 76 or other equivalent measuring circuit. A signal generator 78 provides a periodic ramp voltage or other time-varying output, which drives both the voltage bias input $V_{bias}$ of the RTD oscillator 30 and the X-input of the oscilloscope 76. The output OUT of the RTD oscillator 30 drives the external-cavity laser 34, the output of which probes a device under test 80, which may either be a purely optical medium, in which case its output 82 is an optical signal, or be an optically sensitive electronic circuit, in which case its output 82 is an electronic signal. In both cases, the output 82 is connected to the Y-input of the oscilloscope 76 (perhaps via an optical-to-electrical detector). Thereby, as the time-controlled probing optical signal is repetitively scanned over the horizontal time axis of the oscilloscope 76, the response is displayed on the oscilloscope's vertical axis. Electrooptical testing of electrical circuits is well known, but it has not found widespread usage because of the lack of a compact picosecond optical pulse source, which the present invention provides.

Figure 9:
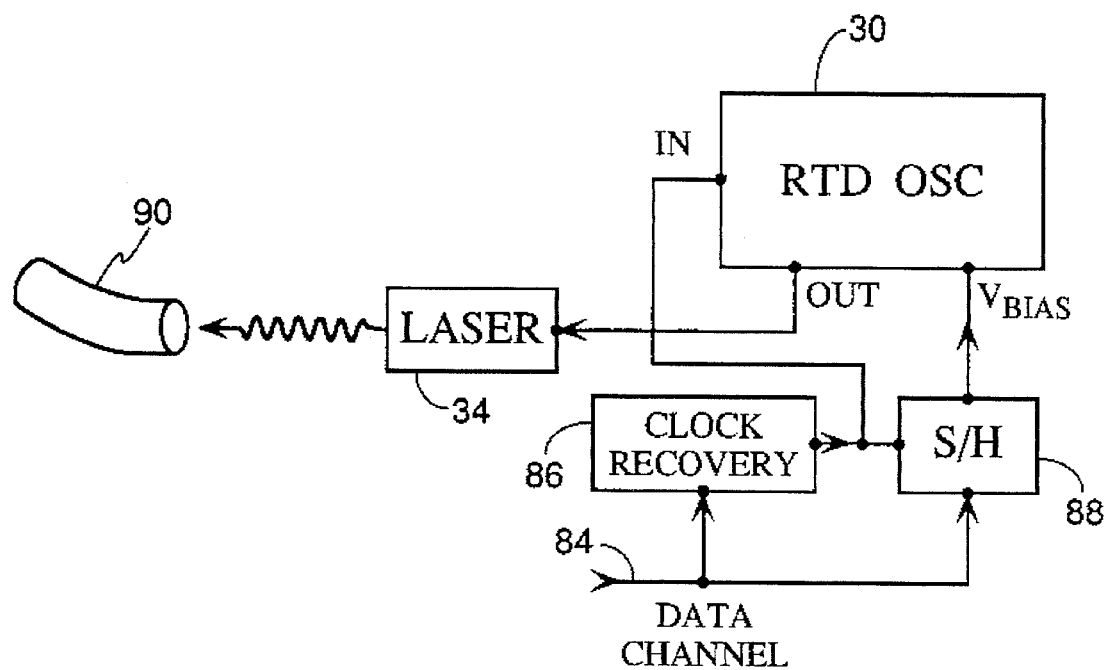
FIG. 9 is a schematic diagram of a communication system using pulse-position modulation.

A fourth embodiment is illustrated in FIG. 9. A data channel 84 carries a train of digitally encoded electronic signals. A clock recovery circuit 86 recovers the timing of the data train and triggers a sample-and-hold circuit 88 that latches the digital data for its clock period. It is assumed that the digital data is binary although a more finely graduated digitized or even analog signal can be accommodated by the invention. The clock recovery circuit 86 also clocks the RTD oscillator 30 on its input terminal IN. The output of the sample-and-hold circuit 88 controls the bias voltage input $V_{bias}$ and is normalized to the binary (or higher) voltage bias levels dictated by the biasing response curve 74 of FIG. 7. The pulse position of the output OUT is thus controlled by the data value on the data channel 84, and the external-cavity laser 34 outputs the pulse-position modulated signal onto an optical channel such as an optical fiber 90. It is expected that the RTD can oscillate at 10 GHz and that the bias voltage input $V_{bias}$ can be modulated at 1 GHz.

Figure 10:
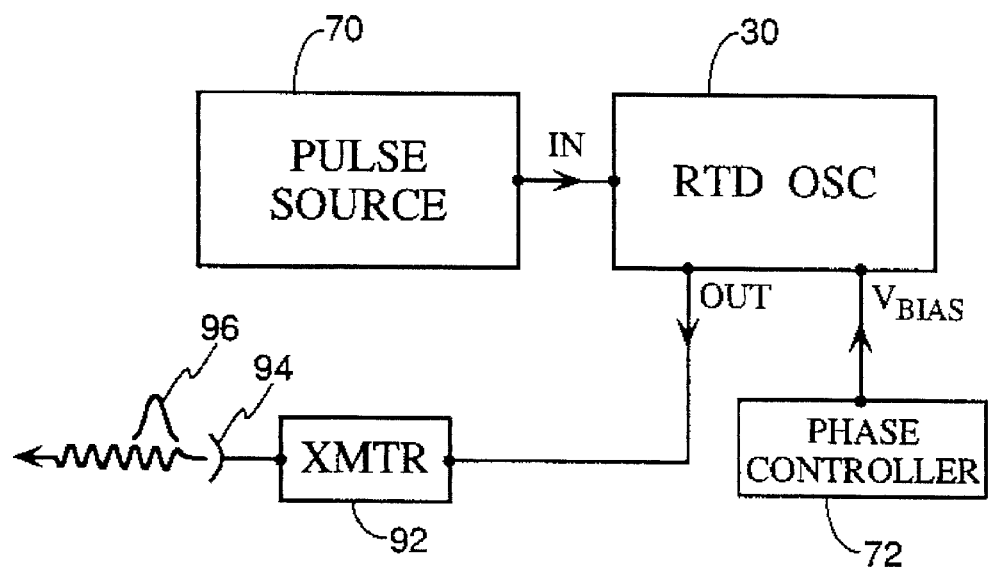
FIG. 10 is a schematic diagram of a microwave transmitter having controllable phase.

A fifth embodiment of the invention, illustrated schematically in FIG. 10, appears similar to the second embodiment of FIG. 6, but it replaces the laser with a microwave transmitter 92 feeding an transmitting antenna 94. The phase of an RF pulse 96 transmitted from the antenna 94 depends upon the voltage output $V_{bias}$ of the phase controller 72. In the prior art, such radar pulse control was typically achieved with microwave delay lines.

Despite their superficial similarities, the laser and radar embodiments operate according to fundamentally different principles. In the laser embodiments, the pulsating electrical output of the RTD at ~$10^9$ Hz provides an envelope for the laser's optical output at a significantly higher frequency of ~$10^{15}$ Hz. In the microwave embodiments, the RTD frequency is close to the frequency of the microwave output, thereby allowing the control of the relative phase of different microwave emitters.

Figure 11:
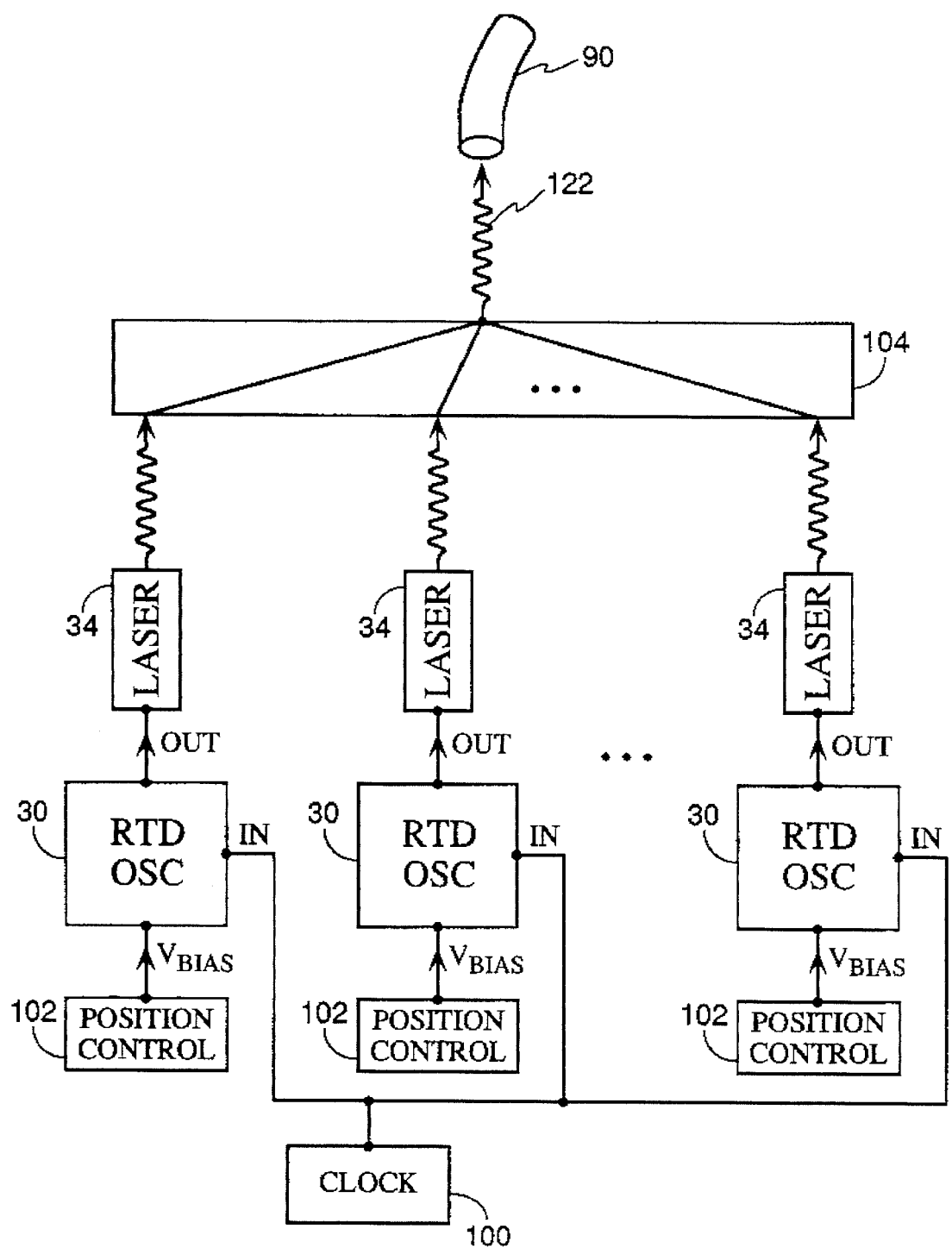
FIG. 11 is a schematic diagram of an optical multi-frequency pulse-position modulation system.

A sixth embodiment of the invention, illustrated in FIG. 11, provides multiple synchronized but displaced trains of optical pulses. An external clock 100 outputs a periodic control pulse to the inputs IN of a plurality of RTD oscillators 10. An associated position controller 102 inputs a biasing voltage $V_{bias}$ to each RTD oscillator 30 to thereby control the phase or position of the optical pulse output from a laser 34 which that RTD oscillator 30 controls. An optical combiner 104, e.g., a fused coupler, may combine the laser outputs into a single optical pathway on the optical fiber 90. The position controllers 102 provide differential phase control to the different optical output pulse trains to modulate the relative pulse position between the different pulse trains. The controllers 102 may modulate the pulse trains of the same repetition rates within narrow respective windows or may slowly modulate the respective pulse trains having different repetition rates.

Figure 12:
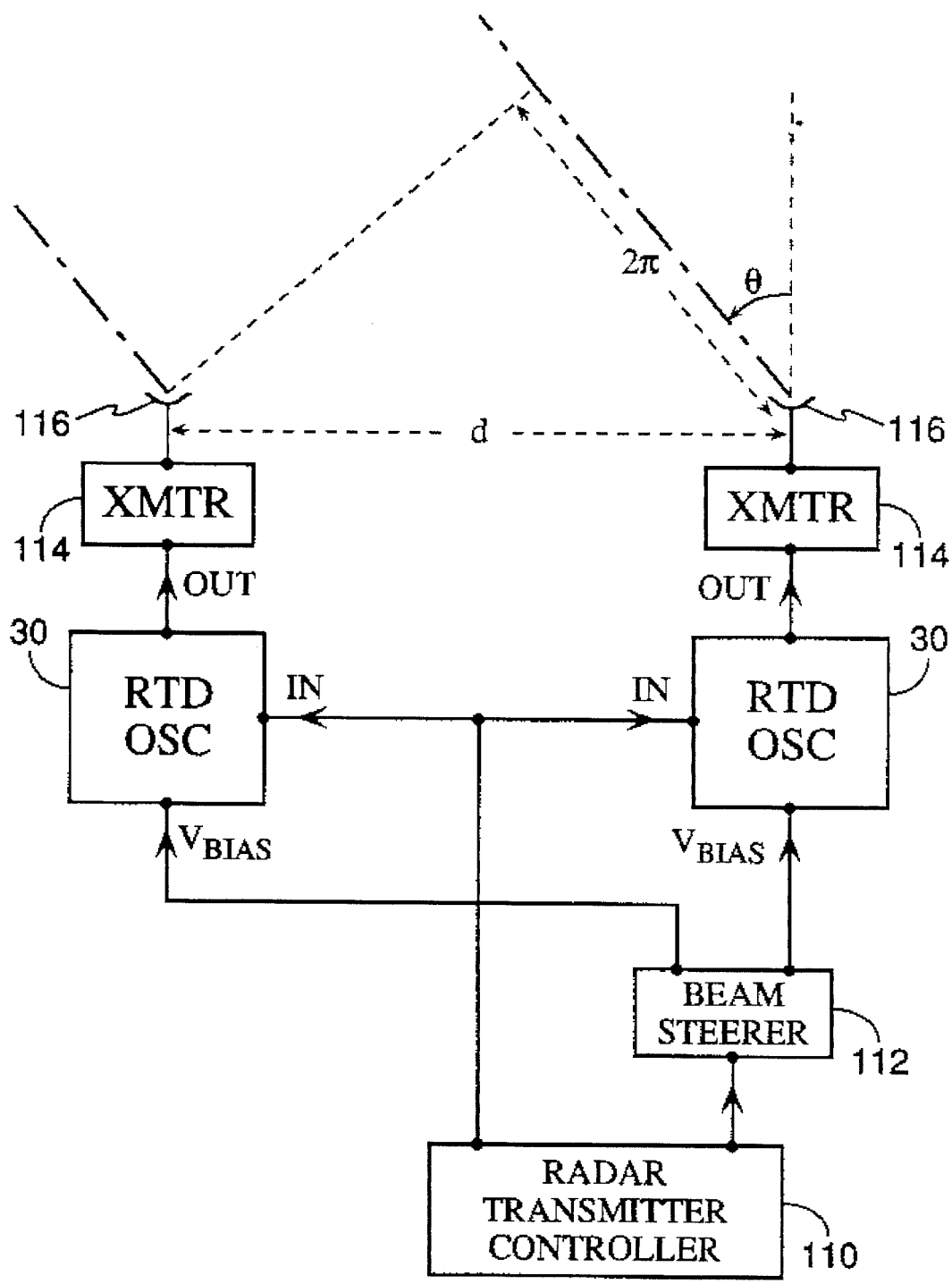
FIG. 12 is a schematic diagram of a phased-array radar system.

A seventh embodiment of the invention, illustrated in FIG. 12, is a phased-array radar. It includes a transmitter controller 110, which outputs both a radar triggering pulse to the timing inputs IN of two or more RTD oscillators 30 and a steering control signal to a beam steerer 112. The beam steerer 112 outputs two voltage bias signals to the bias voltage input $V_{bias}$ of the RTD oscillators 30 and initiates two pulses having a phase $\phi$, between them as referenced to the wavelength $\lambda$ of the emitted electromagnetic radiation, here in the microwave. That is, the differential pulse phase $\phi$ depends on the difference in the voltage the beam steerer 112 feeds to the two RTD oscillators 30. These pulse signals control the relative phase of the trigger signals delivered to two radar transmitters 114 by the output terminals OUT of the oscillators 30. The transmitters 114 output high powered pulses to two associated antennas 116. Although they transmit generally omnidirectionally, because of the differential phase $\phi$ between them, as controlled by the beam steerer 112, their outputs in the far field additively combine in the direction $\theta$, $$\theta = \sin^{-1}\frac{\phi\lambda}{2\pi d}, \quad (4)$$

where $\lambda$ is the wavelength of the radiation emitted from the antennas 116 and d is the spacing between them, as has been described in chapter 7 of *Radar Handbook*, 2nd ed., ed. Skolnik (McGraw-Hill, 1990). Thus, varying the relative biasing voltages $V_{bias}$ delivered to the two RTD oscillators 30 will control the angle $\theta$ at which the two transmitter antennas 116 will emit the radar pulse.

In a practical phased-array radar, there are many more than two transmitters, and the transmitters can be arranged in a two-dimensional array for two-dimensional steering of the beam. Furthermore, the continuous phase control afforded by the RTD oscillator circuits easily provides conformal radar in which the radiating elements are not simply and periodically spaced, but instead are irregularly spaced and therefore irregularly phase controlled, as would be required for placement on an airplane wing.

Figure 13:
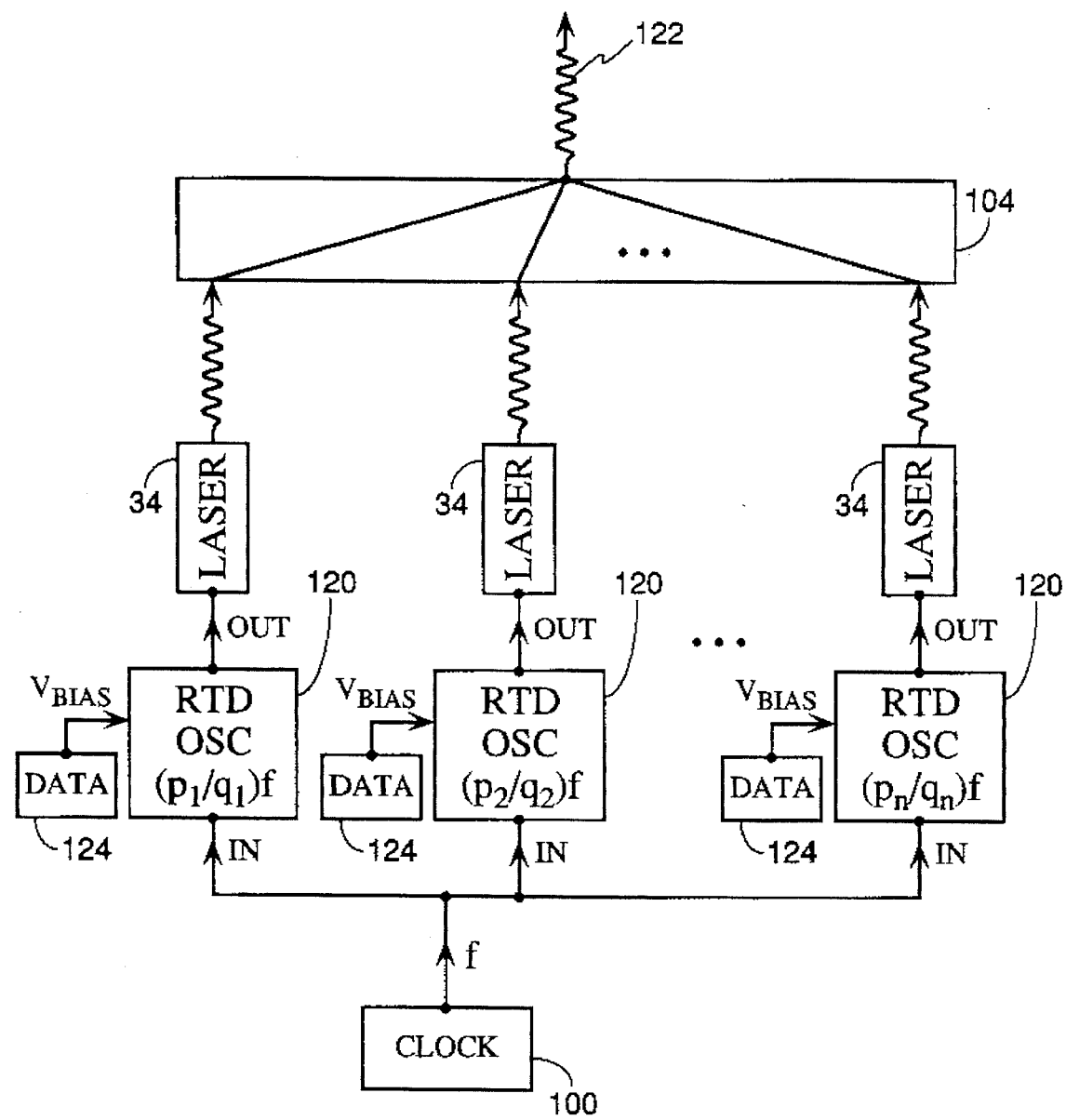
FIG. 13 is a schematic diagram of a multi-frequency optical pulse generator.

An eighth embodiment of the invention, illustrated in FIG. 13, outputs tightly synchronized pulse trains of different frequencies. It relies upon an effect similar to that which Lann et al. described in the previously cited article. Specifically, an RTD can be locked to rational fractions of the natural self-oscillation frequency of the RTD.

The external clock 100 outputs a master pulse train signal at a frequency f. A plurality n of RTD oscillator circuits 120 are tuned by the inductor and capacitors in their respective loading circuits to respective self-oscillation frequencies $(p_i/q_i)\cdot f$, where $p_i$ and $q_i$ are nearly arbitrarily chosen integers and their ratios are close to one. The biasing circuits of the oscillators 120 are the same as oscillators 30 in FIG. 4 although there is no input IN and no resistor 46 and no capacitor 48.

The external clock 100 triggers the oscillator circuits 120 at the frequency f, but because of the frequency locking observed by Lann et al., the oscillator circuits 120 output respective pulse trains at respective frequencies $(p_i/q_i)\cdot f$, where f is the master clock frequency, and thus the oscillator circuits 120 drive their respective mode-locked laser 34 at these frequencies. Their optical outputs are parallel optical pulse trains having respective pulse repetition picosecond frequencies $(p_i/q_i)\cdot f$. Importantly, the pulse trains at different frequencies are frequency locked. These parallel optical pulse trains can be combined by the beam combiner 104 into a single optical channel 122.

An advantage of the embodiment of FIG. 13 is that the system can impress upon the single output channel 122 a pulse train having an overall frequency greater than that which any individual RTD oscillator 120 can provide. Furthermore, the lasers 34 can be modulated by separate data sources 124 temporally varying the bias voltage $V_{bias}$ of the respective RTD oscillator circuit 120. Thereby, the optical pulses at a given carrier repetition rate have their pulse position modulated according to impressed data. At the output end, separate receivers can be tuned to the different electrical frequencies $(p_i/q_i)\cdot f$ to receive only the data in that channel.

Figure 1:
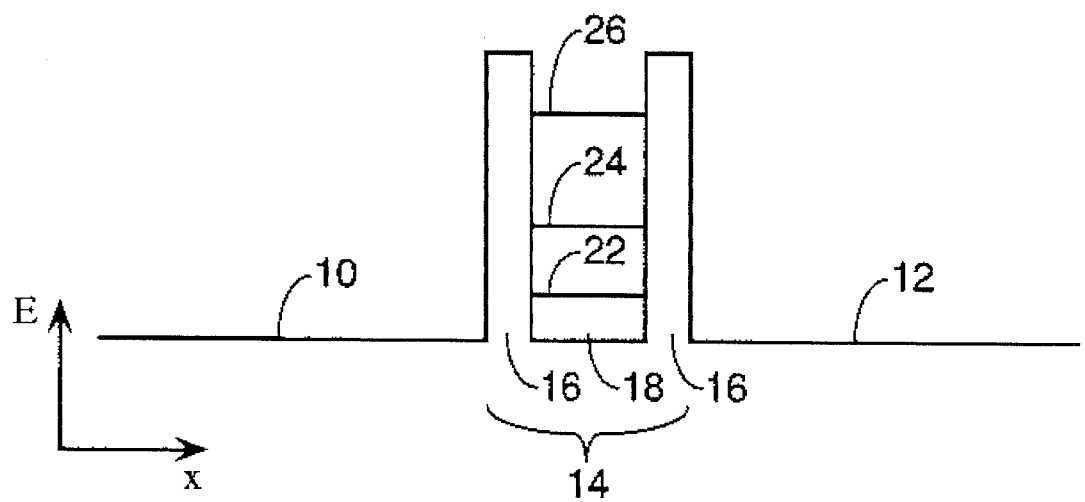
FIGS. 1 and 2 are electronic band-structure diagrams illustrating the operation of a simple resonant tunneling diode (RTD).
Figure 2:
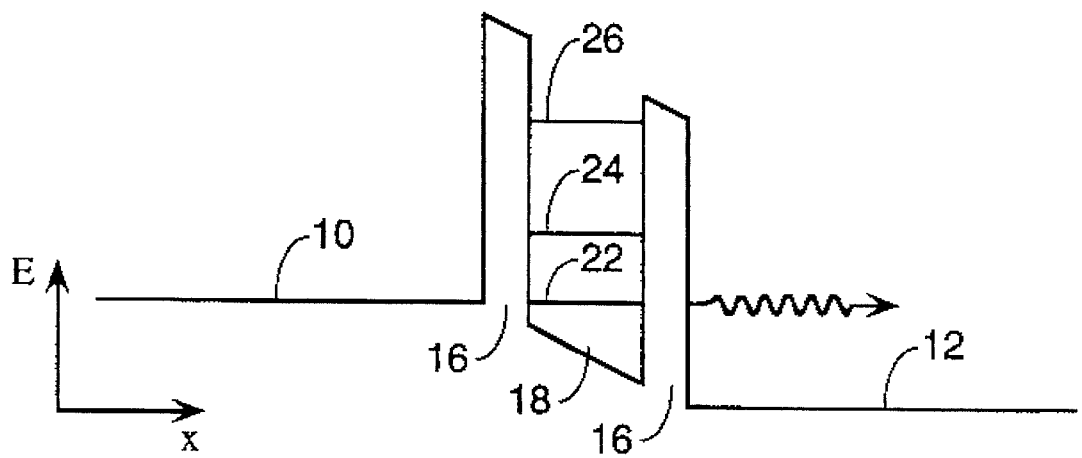

Although the preceding embodiments have been presented for the simple RTD structure of FIG. 1, Capasso et al. explain in the above cited text how many more complex structures provide similar results and thus are usable with the embodiments described above.

The invention thus provides a driving source of very high-frequency electrical signals. In particular, the invention enables the mode locking of a semiconductor diode laser, thereby providing a compact, picosecond pulse source. However, the invention can be applied to a number of other applications in which the RTD oscillator controls the phase of an output signal.

What is claimed is:

1. A phase controlled oscillator, comprising:

a resonant-tunneling device;

a biasing circuit controlling said resonant-tunneling device;

a periodic electrical source connected to an input of said biasing circuit; and a phase-controlling electrical input varying, if at all, at a rate substantially less than that of said periodic pulse source and connected to a biasing input of said biasing circuit, thereby controlling a phase of an output of said resonant-tunneling device and said biasing circuit relative to said periodic source.

2. An oscillator as recited in claim 1, wherein said periodic pulse source is said output of said resonant-tunneling diode.

3. An oscillator as recited in claim 1, further comprising a pulse circuit apart from said biasing circuit and having an output connected to said biasing circuit.

4. An oscillator as recited in claim 1, wherein said phase-controlling electrical input comprises a controllably varying electrical input.

5. An oscillator as recited in claim 1, further comprising a laser driven by said output of said resonant-tunneling device and of said biasing circuit.

6. An oscillator as recited in claim 5, comprising a plurality of sets, each sets comprising a respective said resonant-tunneling device, a respective said biasing circuit, and a respective said laser, a single periodic source connected to all of said biasing circuits.

7. An oscillator as recited in claim 6, further comprising means for combining optical outputs of said respective lasers.

8. An oscillator as recited in claim 7, wherein said combining means combines said optical outputs onto an optical fiber and wherein each of said sets has a respective data channel driving a respective said phase-controlling electrical input.

9. An oscillator as recited in claim 6, wherein said biasing circuits bias their respective lasers to different frequencies related by rational fractions.

10. An oscillator as recited in claim 1, further comprising a microwave radiator of a frequency that is phase controllable by and driven by said output of said resonant-tunneling device and of said biasing circuit.

11. An oscillator as recited in claim 10, comprising a plurality of sets, each set comprising a respective said resonant-tunneling device, a respective said biasing circuit, and a respective said laser, a single periodic pulse source connected to all of said biasing circuits.

12. An oscillator as recited in claim 10, further comprising a plurality of physically separated transmitters accepting outputs of respective biasing circuits, thereby providing a phased array radar.

13. An oscillator driven laser, comprising:
a resonant-tunneling diode;
a biasing circuit for said resonant-tunneling diode, whereby said resonant-tunneling diode oscillates;
a periodic source connected to a timing input of said biasing circuit;
a variable electrical source connected to a phase-controlling input of said biasing circuit, whereby a phase of an output of said biasing circuit relative to said periodic source is controlled.
a laser connected to an output of said biasing circuit and driven thereby to be mode locked thereto.

14. A method of controlling the phase of an electrical emitter, comprising the steps of:
pulsing a self-resonating biasing circuit including a resonant-tunneling diode and having a pulse output;
varying an analog timing input of said biasing circuit to thereby control a phase of said pulse output relative to said pulsing; and
driving an electromagnetic emitter with said pulse output to be thereby frequency locked to said pulsing with a phase relative thereto determined by said analog timing input.

15. A method as recited in claim 14, wherein said electromagnetic emitter is a laser and said biasing circuit controls an envelope of emissions of said laser.

16. A method as recited in claim 14, wherein said electromagnetic emitter is a microwave emitter and said biasing circuit controls an sinusoidal phase of emissions of said microwave emitter.

* * * * *